United States Patent
Cao et al.

(10) Patent No.: US 12,223,996 B2
(45) Date of Patent: Feb. 11, 2025

(54) ADDRESS SELECTION CIRCUIT AND CONTROL METHOD THEREOF, AND MEMORY

(71) Applicant: CHANGXIN MEMORY TECHNOLOGIES, INC., Hefei (CN)

(72) Inventors: Xianlei Cao, Hefei (CN); Xian Fan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 152 days.

(21) Appl. No.: 18/154,256

(22) Filed: Jan. 13, 2023

(65) Prior Publication Data

US 2023/0326512 A1 Oct. 12, 2023

(30) Foreign Application Priority Data

Mar. 23, 2022 (CN) .......................... 202210287583.5

(51) Int. Cl.
*G11C 11/40* (2006.01)
*G11C 11/406* (2006.01)
*G11C 11/408* (2006.01)

(52) U.S. Cl.
CPC .. *G11C 11/40622* (2013.01); *G11C 11/40615* (2013.01); *G11C 11/4087* (2013.01)

(58) Field of Classification Search
CPC ........ G11C 11/40622; G11C 11/40615; G11C 11/4087; G11C 11/4063; G11C 11/406; G11C 11/408
See application file for complete search history.

(56) References Cited

U.S. PATENT DOCUMENTS

| | | | |
|---|---|---|---|
| 2020/0058346 A1* | 2/2020 | Ito | G11C 11/4087 |
| 2023/0021622 A1* | 1/2023 | Cho | G11C 11/4078 |
| 2023/0185460 A1* | 6/2023 | Kim | G06F 3/0653 |
| | | | 711/105 |

FOREIGN PATENT DOCUMENTS

CN 112786087 A 5/2021

\* cited by examiner

*Primary Examiner* — Mohammed A Bashar
(74) *Attorney, Agent, or Firm* — Syncoda LLC; Feng Ma

(57) ABSTRACT

Embodiments of the present disclosure relate to an address selection circuit and a control method thereof, and a memory. The address selection circuit includes an address receiving circuit, a row hammer address generation circuit, and a decoding circuit. The address receiving circuit is configured to output a first address output signal in response to a first selection signal, where the first address output signal includes a received regular refresh address signal or an active address signal. The row hammer address generation circuit is configured to: generate a second address output signal and a row hammer address redundancy identifier according to the first selection signal, an actual active address signal, and the first address output signal. The decoding circuit is configured to: generate a target address and the actual active address signal according to the second address output signal and the row hammer address redundancy identifier.

12 Claims, 8 Drawing Sheets

ADDRESS SELECTION CIRCUIT AND CONTROL METHOD THEREOF, AND MEMORY

CROSS-REFERENCE TO RELATED APPLICATION

This application claims the priority of Chinese Patent Application No. 202210287583.5, submitted to the Chinese Intellectual Property Office on Mar. 23, 2022, the disclosure of which is incorporated herein in its entirety by reference.

TECHNICAL FIELD

Embodiments of the present disclosure relate to the technical field of storage of semiconductors, and in particular, to an address selection circuit and a control method thereof, and a memory.

BACKGROUND

With the rapid development of semiconductor storage technologies, the market imposes increasingly high requirements on storage capacity and storage performance of the semiconductors, leading to a gradual reduction in a physical volume of a single memory bit.

However, the reduction in the physical volume of the memory bit leads to a reduction in charges stored by the single memory bit and an increase in the loss probability of data in the memory bit.

To suppress a row hammer effect, a timely refresh operation is required on a row hammer address to replenish charges and avoid errors in stored data. Therefore, there is an urgent need to provide an address selection circuit that supports a refresh operation, to improve the storage performance and reliability of a memory while ensuring that the physical volume of the single memory bit is relatively small.

SUMMARY

Based on this, it is necessary to provide an address selection circuit and a control method thereof, and a memory for the technical problem in the foregoing background.

To implement the foregoing objective and other objectives, an aspect of embodiments of the present disclosure provides an address selection circuit, including an address receiving circuit, a row hammer address generation circuit, and a decoding circuit. The address receiving circuit is configured to output a first address output signal in response to a first selection signal, where the first address output signal includes a received regular refresh address signal or an active address signal. The row hammer address generation circuit is connected to the address receiving circuit and is configured to: generate a second address output signal and a row hammer address redundancy identifier according to a received first selection signal, an actual active address signal, and the first address output signal. The decoding circuit is connected to the row hammer address generation circuit and is configured to: generate a target address and the actual active address signal according to a received second address output signal and the row hammer address redundancy identifier.

Another aspect of the embodiments of the present disclosure provides a memory, including a memory block and the address selection circuit according to any one of the embodiments of the present disclosure. The address selection circuit is connected to the memory block and the address selection circuit is configured to output a target address to the memory block.

Still another aspect of the embodiments of the present disclosure provides a control method of an address selection circuit, including: outputting a received regular refresh address signal or an active address signal in response to a first selection signal; generating, based on a row hammer address generation circuit, a second address output signal and a row hammer address redundancy identifier according to a received first selection signal, an actual active address signal, and an output signal of an address receiving circuit; and generating, based on a decoding circuit, a target address and the actual active address signal according to a received second address output signal and the row hammer address redundancy identifier.

BRIEF DESCRIPTION OF THE DRAWINGS

To describe the technical solutions in the embodiments of the present disclosure more clearly, the accompanying drawings required to describe the embodiments are briefly described below. Apparently, the accompanying drawings described below are only some embodiments of the present disclosure. Those of ordinary skill in the art may further obtain other accompanying drawings on these accompanying drawings without creative efforts.

DETAILED DESCRIPTION

To facilitate the understanding of the present disclosure, the present disclosure is described more completely below with reference to the related accompanying drawings. The preferred embodiments of the present disclosure are shown in the accompanying drawings. However, the present disclosure may be embodied in various forms without being limited to the embodiments described herein. On the contrary, these embodiments are provided to make the present disclosure more thorough and comprehensive.

Unless otherwise defined, all technical and scientific terms used in the specification have the same meaning as commonly understood by those skilled in the technical field of the present disclosure. The terms used in the specification of the present disclosure are merely for the purpose of describing specific embodiments, rather than to limit the present disclosure. In addition, some terms used throughout the description and the following claims refer to specific elements. It will be appreciated by those skilled in the art that manufacturers may use different names to refer to elements. This document is not intended to distinguish between elements that have different names but the same function. The terms "comprise" and "include" used in the following description and embodiments are all open and thus should be construed as "including but not limited to . . . ". Likewise, the term "connection" is intended to mean indirect or direct electrical connection. Correspondingly, if a device is connected to another device, the connection may be achieved by direct electrical connection or by indirect electrical connection through other device and a connecting piece.

It is to be understood that the terms such as "first" and "second" may be used herein to describe various elements, but these elements are not limited by such terms. Instead, these terms are merely intended to distinguish one element from another. For example, without departing from the scope of the present disclosure, a first element may be referred to as a second element, and similarly, a second element may be referred to as a first element.

Figure 1:
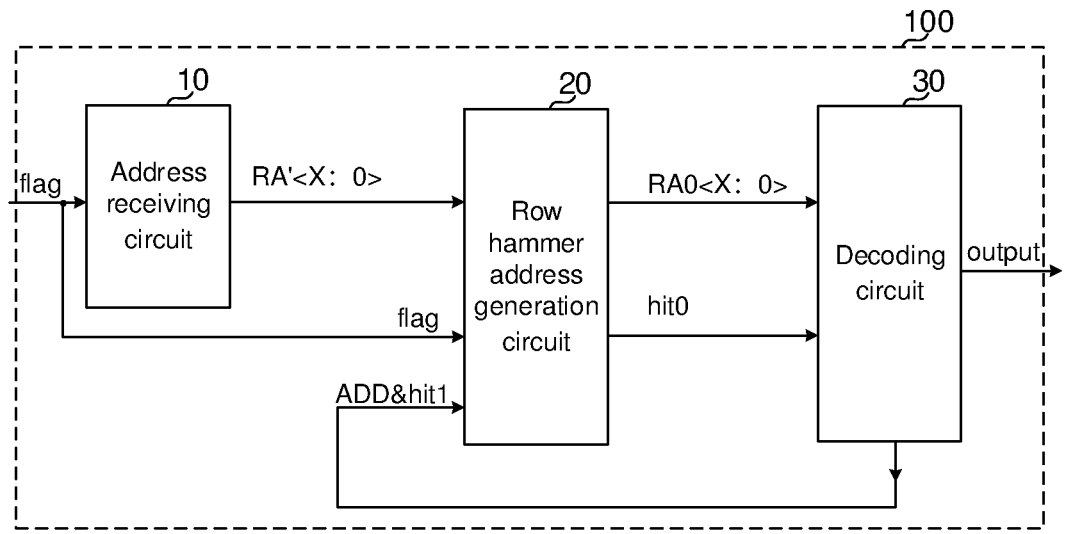
FIG. 1 to FIG. 5 and FIG. 7 are each a schematic diagram of a circuit principle of an address selection circuit according to different embodiments of the present disclosure.

Referring to FIG. 1, an embodiment of the present disclosure provides an address selection circuit 100, including an address receiving circuit 10, a row hammer address generation circuit 20, and a decoding circuit 30. The address receiving circuit 10 is configured to output a first address output signal RA'<X:0> in response to a first selection signal flag, where the first address output signal RA'<X:0> includes a received regular refresh address signal or an active address signal. The row hammer address generation circuit 20 is connected to the address receiving circuit 10 and is configured to: generate a second address output signal RA0<X:0> and a row hammer address redundancy identifier hit0 according to the received first selection signal flag, an actual active address signal ADD&hit1, and the first address output signal RA'<X:0>. The decoding circuit 30 is connected to the row hammer address generation circuit 20 and is configured to: generate a target address output and the actual active address signal ADD&hit1 according to the received second address output signal RA0<X:0> and the row hammer address redundancy identifier hit0. According to this embodiment, a redundancy address in row hammer addresses of the target address can be automatically identified, to repair a word line corresponding to the redundancy address and refresh a row hammer address corresponding to the repaired word line, and whether the target address is a redundancy address can also be automatically identified, to repair the identified redundancy address and refresh a row hammer address corresponding to a word line after the repair, thereby improving the performance and reliability of the memory while ensuring that a density and a quantity of memory bits in a memory array are not reduced.

Figure 2:
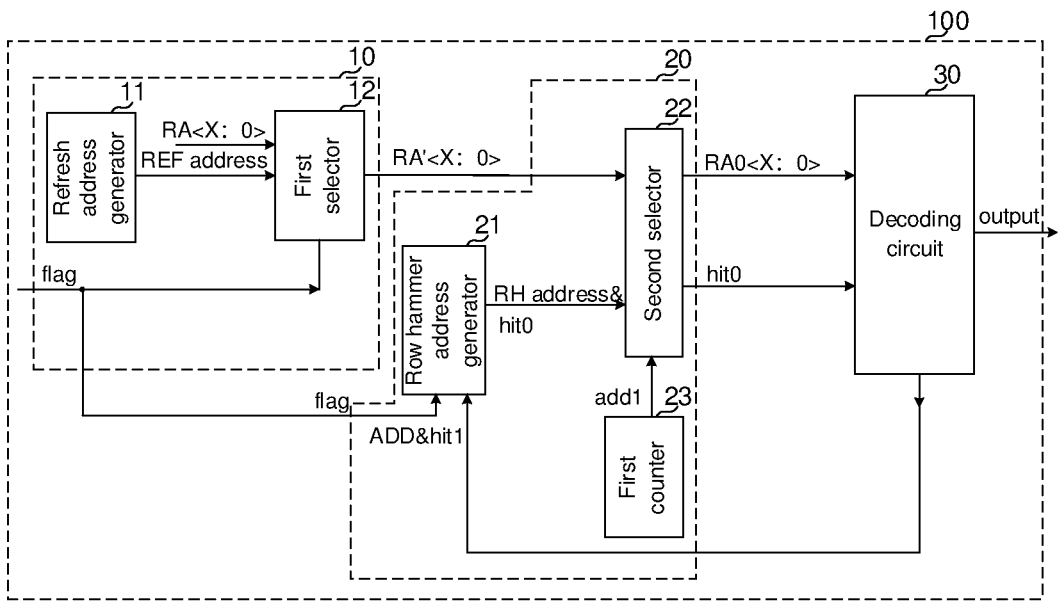

In an example, referring to FIG. 2, the address receiving circuit 10 includes a refresh address generator 11 and a first selector 12. The refresh address generator 11 is configured to generate a regular refresh address signal REF address. The first selector 12 is configured to receive the regular refresh address signal REF address, an active address signal RA<X:0>, and a first selection signal flag and is configured to: output the active address signal RA<X:0> during a period when the first selection signal flag indicates an active state, and output the regular refresh address signal REF address during a period when the first selection signal flag indicates a refresh state, to facilitate decoding performed according to the active address signal RA<X:0> to select a corresponding word line during a subsequent active operation period, determining of whether the selected word line needs to be repaired, and repairing of the word line needing to be repaired, such that a word line corresponding to a redundancy address is repaired and a row hammer address is refreshed, thereby improving the storage performance and reliability of a memory while ensuring that a density and a quantity of memory bits in a memory array are not reduced.

In an example, still referring to FIG. 2, the row hammer address generation circuit 20 includes a row hammer address generator 21 and a second selector 22. The row hammer address generator 21 is configured to: receive the first selection signal flag and the actual active address signal ADD&hit1, and generate a row hammer address signal RH address and the row hammer address redundancy identifier hit0 according to the actual active address signal ADD&hit1 during the period when the first selection signal flag indicates the active state. The second selector 22 is configured to receive a second selection signal add1 and connect to an output terminal of the row hammer address generator 21 and an output terminal of the first selector 12 and is configured to: sequentially receive and output the first address output signal RA'<X:0> as the second address output signal RA0<X:0> before receiving the second selection signal add1; stop outputting the first address output signal RA'<X:0> when receiving the second selection signal add1, receive and output the row hammer address signal RH address as the second address output signal RA0<X:0>, and output the row hammer address redundancy identifier hit0; and resume receiving and outputting the first address output signal RA'<X:0> as the second address output signal RA0<X:0> after outputting the row hammer address signal RH address. In this embodiment, a transmission path is switched for the first address output signal RA'<X:0> and the row hammer address signal RH address based on the second selector 22 in response to the second selection signal add1, to implement decoding performed according to the active address signal RA<X:0> to select a corresponding word line during a subsequent active operation period, determining of whether the selected word line needs to be repaired, and repairing of the word line needing to be repaired, such that a word line corresponding to a redundancy address is repaired and a row hammer address is refreshed, thereby improving the storage performance and reliability of a memory while ensuring that a density and a quantity of memory bits in a memory array are not reduced.

In an example, still referring to FIG. 2, the address selection circuit 100 further includes a first counter 23. The first counter 23 is connected to a control terminal of the second selector 22 and is configured to: count a quantity of times for which the second selector 22 outputs the first address output signal RA'<X:0> to obtain a first count value and provide the second selection signal add1 for the second selector 22 when the first count value is equal to a first preset value, to switch to a channel used to receive and transmit the row hammer address signal RH address after receiving and outputting the first address output signal RA'<X:0> as the second address output signal RA0<X:0>, such that a redundancy address in row hammer addresses of the target address can be automatically identified, to repair a word line corresponding to the redundancy address and refresh a row hammer address corresponding to the repaired word line, and whether the target address is a redundancy address can also be automatically identified, to repair the identified redundancy address and refresh a row hammer address corresponding to a word line after the repair, thereby improving the performance and reliability of a memory while ensuring that a density and a quantity of memory bits in an memory array are not reduced.

In an example, still referring to FIG. 2, after the second selector 22 outputs the row hammer address signal RH address, the first counter 23 resets the first count value and stops outputting the second selection signal add1, to automatically switch to a signal transmission channel used to receive and output the first address output signal RA'<X:0> as the second address output signal RA0<X:0>.

Figure 3:
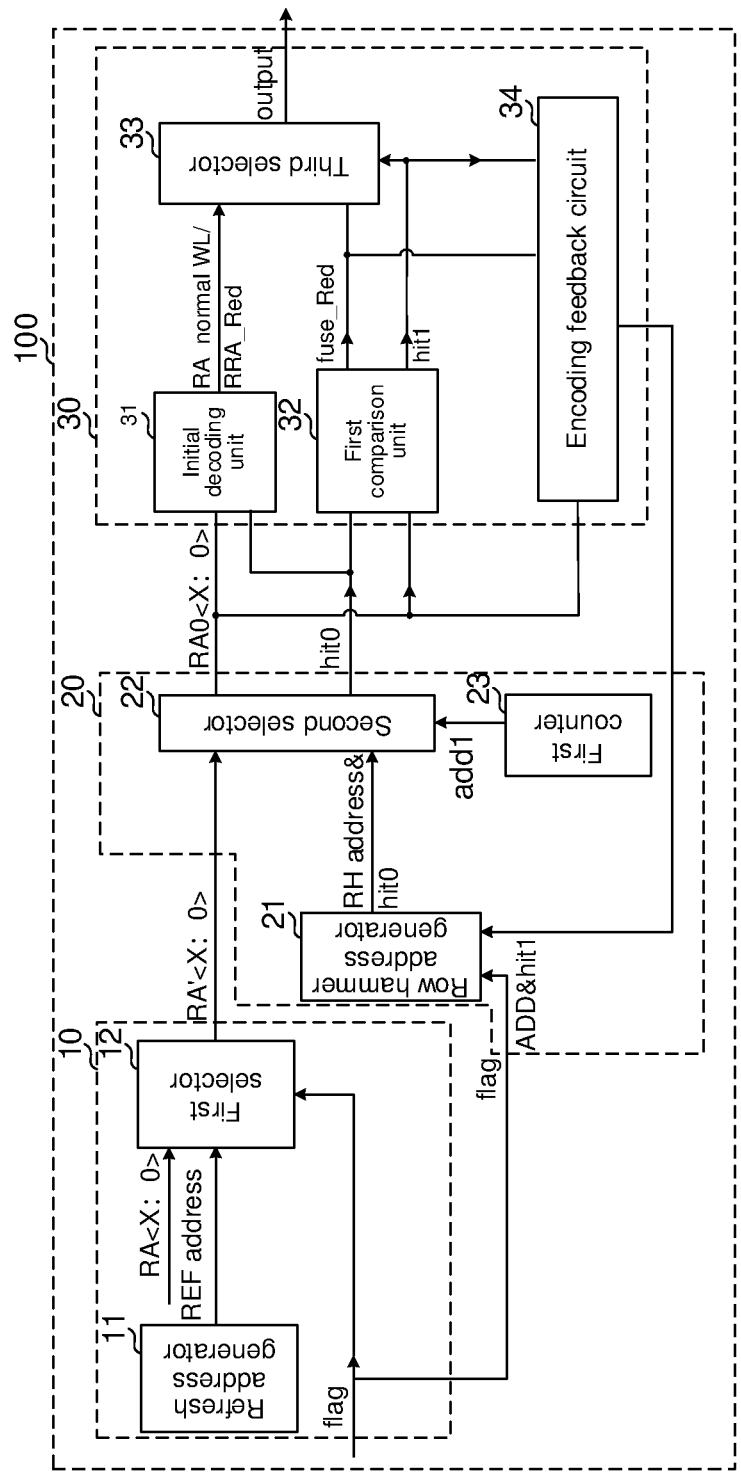

In an example, referring to FIG. 3 and Table 1, the target address output includes at least one of an array word line address RA normal WL, a row hammer redundancy address RRA_Red, and a row hammer repair address fuse_Red; and the decoding circuit 30 includes an initial decoding unit 31, a first comparison unit 32, a third selector 33, and an encoding feedback circuit 34. The initial decoding unit 31 is connected to an output terminal of the second selector 22 and is configured to: receive the second address output signal RA0<X:0> and the row hammer address redundancy identifier hit0, and perform decoding according to the second address output signal RA0<X:0>, to obtain a corresponding array word line address RA normal WL when the row hammer address redundancy identifier hit0 is a negative acknowledgment identifier, or perform decoding according to the second address output signal RA0<X:0>, to obtain a corresponding row hammer redundancy address RRA_Red when the row hammer address redundancy identifier hit0 is an acknowledgment identifier. The first comparison unit 32 is connected to the output terminal of the second selector 22 and is configured to: compare the array word line address RA normal WL corresponding to the second address output signal RA0<X:0> with a prestored repair addresses in a repair address bank when the row hammer address redundancy identifier hit0 is the negative acknowledgment identifier, and output, when determining that the repair address bank includes a repair address the same as the array word line address RA normal WL corresponding to the second address output signal RA0<X:0>, a corresponding row hammer repair address fuse_Red and a corresponding row hammer repair address identifier hit1 of the same repair address. The third selector 33 is provided with a first input terminal connected to an output terminal of the initial decoding unit 31, a second input terminal configured to receive the row hammer repair address fuse_Red output by the first comparison unit 32, and a control terminal configured to receive the row hammer repair address identifier hit1 output by the first comparison unit 32, and configured to: output the array word line address RA normal WL or the row hammer redundancy address RRA_Red when the row hammer repair address identifier hit1 is the negative acknowledgment identifier and output the row hammer repair address fuse_Red when the row hammer repair address identifier hit1 is the acknowledgment identifier. The encoding feedback circuit 34 is connected to each of the row hammer address generation circuit 20, the second selector 22, and the first comparison unit 32 and is configured to: generate and output the actual active address signal ADD&hit1 to the row hammer address generation circuit 20 according to the received second address output signal RA0<X:0>, the row hammer repair address fuse_Red, and a corresponding row hammer repair address identifier hit1. According to this embodiment, a redundancy address in row hammer addresses of the target address can be automatically identified according to the row hammer address redundancy identifier hit0 and the row hammer repair address identifier hit1, to repair a word line corresponding to the redundancy address and refresh a row hammer address corresponding to the repaired word line, and whether the target address is a redundancy address can also be automatically identified, to repair the identified redundancy address and refresh a row hammer address corresponding to a word line after the repair, thereby improving the performance and reliability of the memory while ensuring that a density and a quantity of memory bits in a memory array are not reduced. In this embodiment, the acknowledgment identifier may be specified to "1", and the negative acknowledgment identifier may be specified to "0", and in another embodiment of the present disclosure, the acknowledgment identifier may be specified to "0", and the negative acknowledgment identifier may be specified to "1".

TABLE 1

| hit0 | hit1 | Output |
|------|------|--------|
| 1 | 0 | RRA_Red |
| 0 | 0 | RA normal WL |
| 0 | 1 | fuse_Red |

Figure 4:
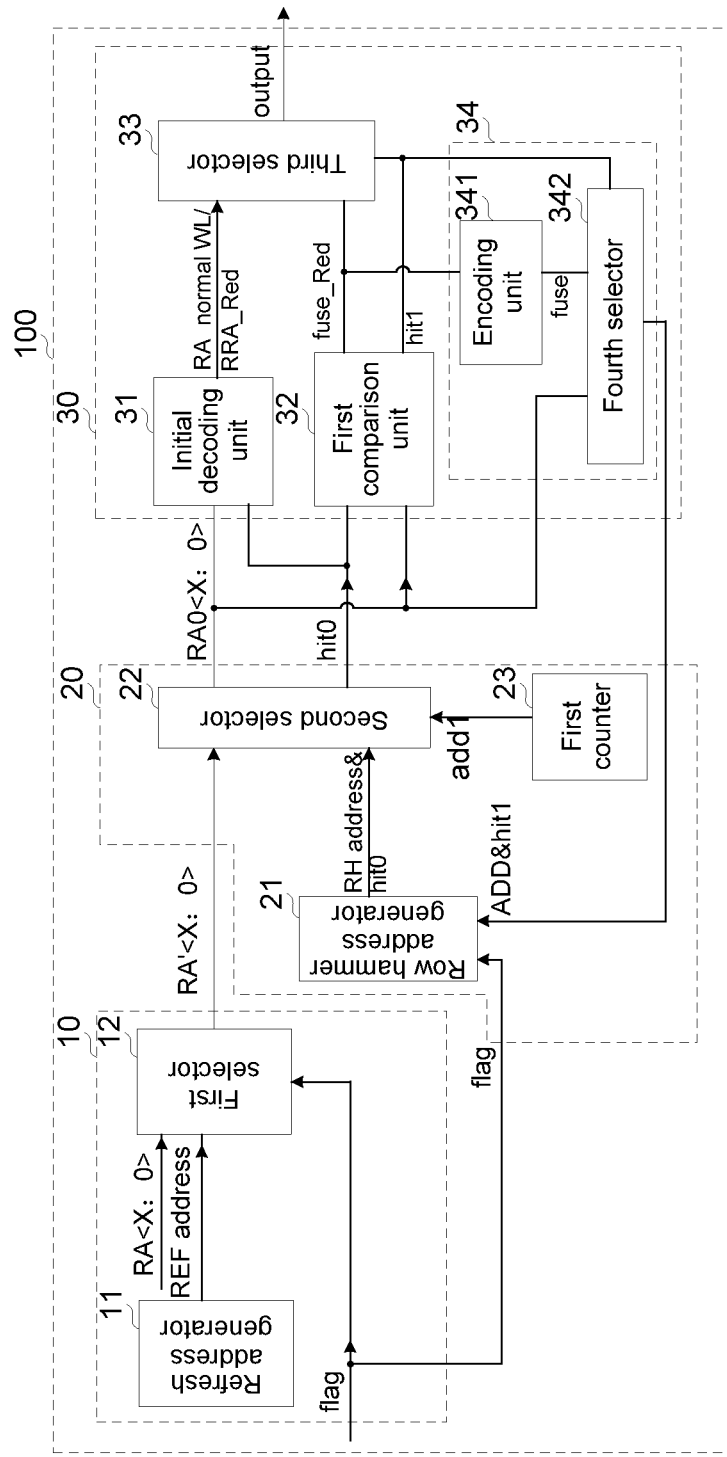

In an example, referring to FIG. 4, the actual active address signal ADD&hit1 includes the second address output signal RA0<X:0> and a row hammer repair address signal fuse; and the encoding feedback circuit 34 includes an encoding unit 341 and a fourth selector 342. The encoding unit 341 is connected to an output terminal of the first comparison unit 32 and is configured to: generate a row hammer repair address signal fuse whose byte length is equal to that of the second address output signal RA0<X:0> according to the row hammer repair address fuse_Red. The fourth selector 342 is provided with a first input terminal connected to the output terminal of the second selector 22, a second input terminal connected to an output terminal of the encoding unit 341, a control terminal connected to the output terminal of the first comparison unit 32, and an output terminal connected to an input terminal of the row hammer address generation circuit 20, and configured to: output the second address output signal RA0<X:0> when the row hammer repair address identifier hit1 is the negative acknowledgment identifier, and output the row hammer repair address signal fuse when the row hammer repair address identifier hit1 is the acknowledgment identifier, to provide the actual active address signal ADD&hit1 for the row hammer address generator 21. In this embodiment, the row hammer repair address identifier hit1 is added when the row hammer address redundancy identifier hit0 is the negative acknowledgment identifier such as "0", to help automatically identify the row hammer repair address fuse_Red, and refresh a row hammer address of a bit line corresponding to the row hammer repair address fuse_Red.

In an example, the row hammer address is an adjacent address of a single target address. Specifically, if the single row address is m, where m is a positive integer, the row hammer address includes a first single row address m−1 and a second single row address m+1. It should be noted that, the row hammer address is a collective term for adjacent addresses, in a unit of "group", and one group of row hammer addresses may include one or more adjacent addresses of one single row address. For example, the row hammer address includes only m+1 or m−1 or further includes at least one of m+2 or m−2.

It should be noted that, this embodiment of the present disclosure focuses on the following case: The address selection circuit outputs at least a row hammer address including a single target address after receiving the row hammer address, to preferentially refresh the row hammer address; regarding a function of the address selection circuit before the row hammer address is received, that is, refreshing performed based on a default refresh sequence of the regular refresh address, details are not described again herein as it belongs to content already known to those skilled in the art.

Figure 5:
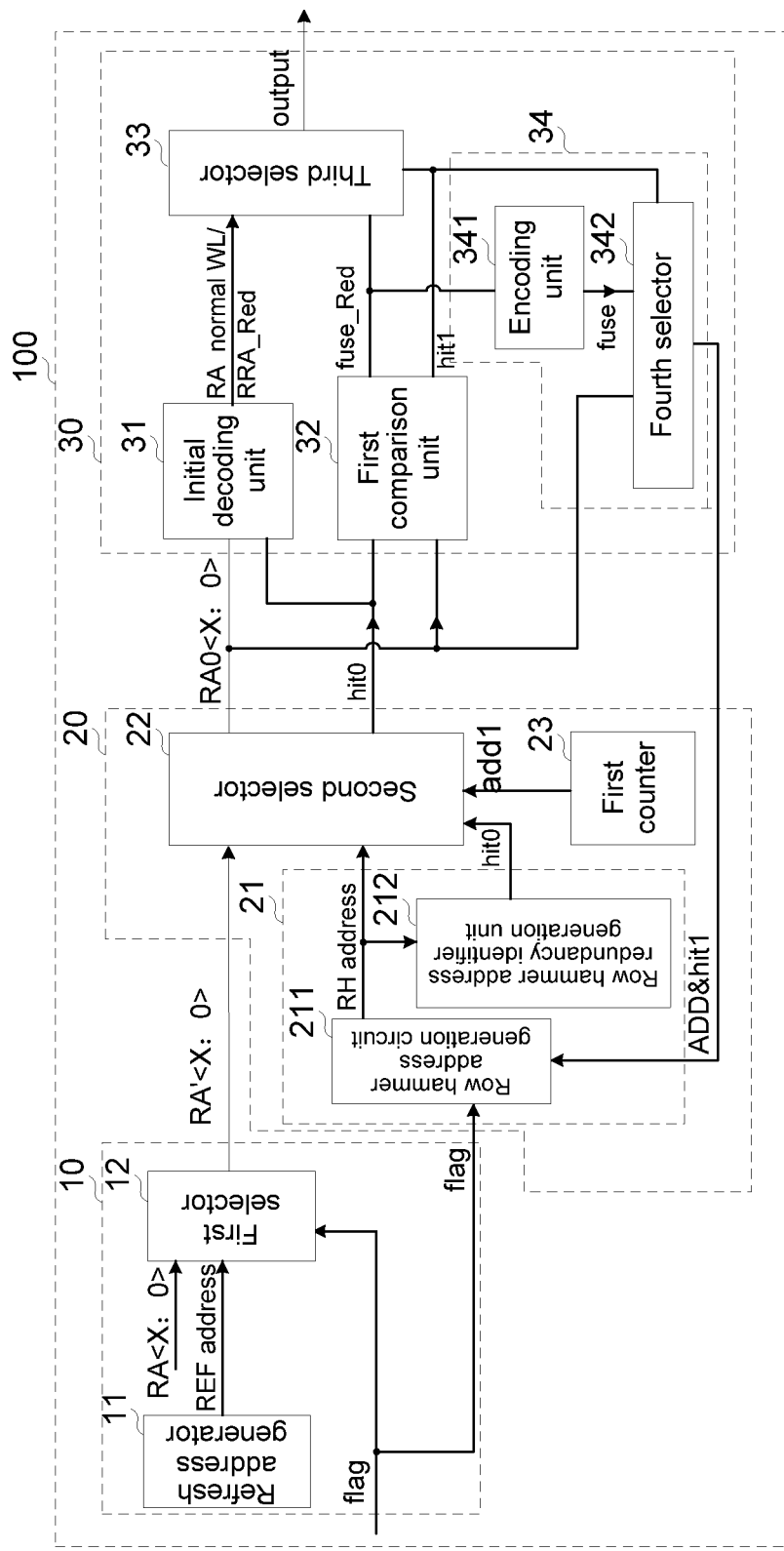

In an example, referring to FIG. 5, the row hammer address generator 21 includes a row hammer address generation circuit 211 and a row hammer address redundancy identifier generation unit 212. The row hammer address generation circuit 211 is configured to receive the first selection signal flag and connect to an input terminal of the second selector 22 and the output terminal of the fourth selector 342 and is configured to generate, according to an active address corresponding to an actual active address signal ADD&hit1 whose quantity of active times is greater than a second preset value and during a period when the first selection signal flag indicates the active state, the row hammer address signal RH address, to be provided for the second selector 22. The row hammer address redundancy identifier generation unit 212 is connected to an output terminal of the row hammer address generation circuit 211 and the input terminal of the second selector 22 and is configured to encode, when the row hammer repair address identifier hit1 represented by the row hammer repair address signal fuse is the negative acknowledgment identifier, the row hammer repair address signal fuse into the row hammer address redundancy identifier hit0, to be provided for the second selector 22. In this embodiment, closed-loop feedback information is provided for the row hammer address generation circuit 211 when the row hammer repair address identifier hit1 is the negative acknowledgment identifier such as "0", the row hammer address generation circuit 211 generates, according to the active address corresponding to the actual active address signal ADD&hit1 whose quantity of active times is greater than the second preset value and during the period when the first selection signal flag indicates the active state, the row hammer address signal RH address, to be provided for the second selector 22, the row hammer address redundancy identifier generation unit 212 generates the row hammer address redundancy identifier hit0, to be provided for the second selector 22, and the second selector 22 is switched to a channel used to receive and transmit the row hammer address signal RH address after receiving and outputting the first address output signal RA'<X:0> as the second address output signal RA0<X:0>, to subsequently automatically identify a redundancy address, repair a word line corresponding to the redundancy address, and refresh a row hammer address corresponding to the repaired word line, thereby improving the storage performance and reliability of a memory.

Figure 6:
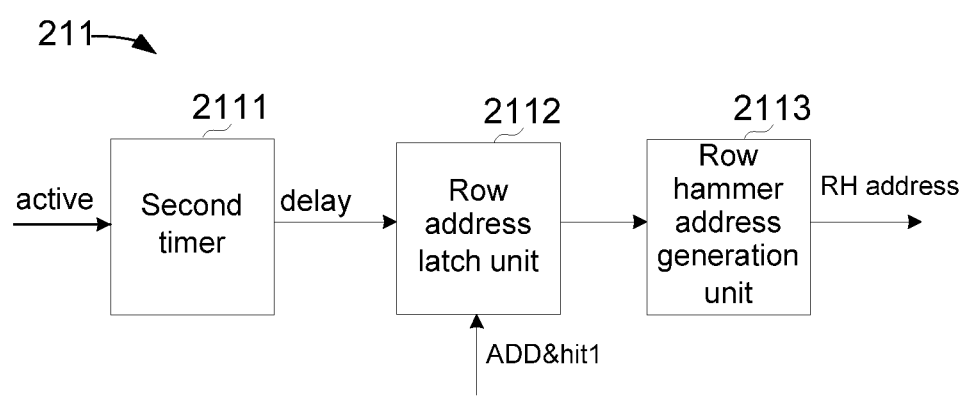
FIG. 6 is a schematic diagram of a circuit principle of a row hammer address generation circuit according to an embodiment of the present disclosure.

In an example, referring to FIG. 6, the first selection signal flag includes an active command active; and the row hammer address generation circuit 211 includes a second timer 2111, a row address latch unit 2112, and a row hammer address generation unit 2113. The second timer 2111 is configured to: receive the active command active to obtain a single activation time of a target address output corresponding to the active command active, and output a timeout signal if the single activation time is greater than a preset time. The row address latch unit 2112 is configured to: receive the actual active address signal ADD&hit1 and connect to the output terminal of the second timer 2111, and latch and output the actual active address signal ADD&hit1 if receiving the timeout signal. The row hammer address generation unit 2113 is configured to: receive the actual active address signal ADD&hit1 output by the row address latch unit 2112, and generate the row hammer address signal RH address according to a row hammer address corresponding to the actual active address signal ADD&hit1. For example, the row hammer address corresponding to the actual active address signal ADD&hit1 includes: a row address of an adjacent previous row and a row address of an adjacent next row that are of a row corresponding to the target address output, to preferentially refresh the row hammer address, and avoid invalidity of data stored in the memory bits caused by a row hammer effect, thereby improving the operation stability and reliability of the memory.

For the memory, each active command usually corresponds to a specific word line, and a single activation duration of the specific word line may be determined according to a receiving time of the active command corresponding to the specific word line. Normally, a standard time corresponding to a single activation duration of a word line of a memory is related to the performance of the memory, and is specifically related to charges stored in a capacitor and a discharge rate of the capacitor under the row hammer effect. The more stored charges or the lower discharge rate of the capacitor under the row hammer effect indicate/indicates a longer single activation time that a specific word line can withstand, that is, indicate/indicates a longer standard time corresponding to the single activation duration of the word line of the memory, and a longer preset time may be specified.

Figure 7:
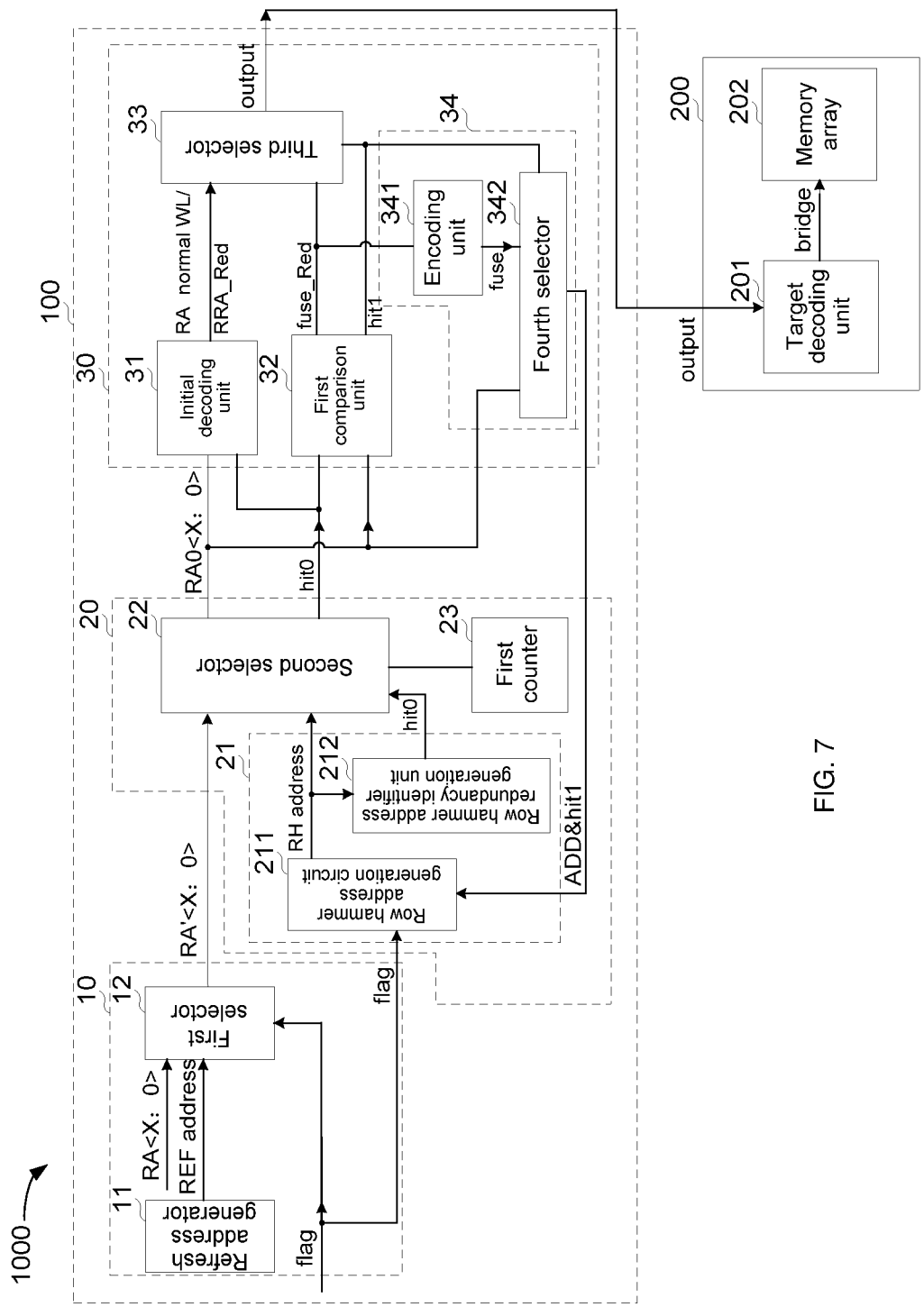

In an example, referring to FIG. 7, an embodiment of the present disclosure provides a memory 1000, including the address selection circuit 100 according to any one of the embodiments of the present disclosure. The address selection circuit 100 is connected to a memory block 200, and the address selection circuit 100 is configured to output a target address output into the memory block 200. According to this embodiment, a redundancy address in row hammer addresses of the target address can be automatically identified, to repair a word line corresponding to the redundancy address and refresh a row hammer address corresponding to the repaired word line, and whether the target address is a redundancy address can also be automatically identified, to repair the identified redundancy address and refresh a row hammer address corresponding to a word line after the repair, thereby improving the performance and reliability of the memory 1000 while ensuring that a density and a quantity of memory bits in a memory array are not reduced.

In an example, referring to FIG. 7, the memory block 200 includes a target decoding unit 201 and a memory array 202. The target decoding unit 201 is connected to an output terminal of a third selector 33 and is configured to: convert a received target address output into a memory cell strobe signal, and send the memory cell strobe signal to a corresponding memory array 202, to repair a word line corresponding to a redundancy address in the memory array 202, and refresh a row hammer address corresponding to the repaired word line, thereby improving the storage performance and reliability of the memory while ensuring a density and a quantity of memory bits in the memory array.

Figure 8:
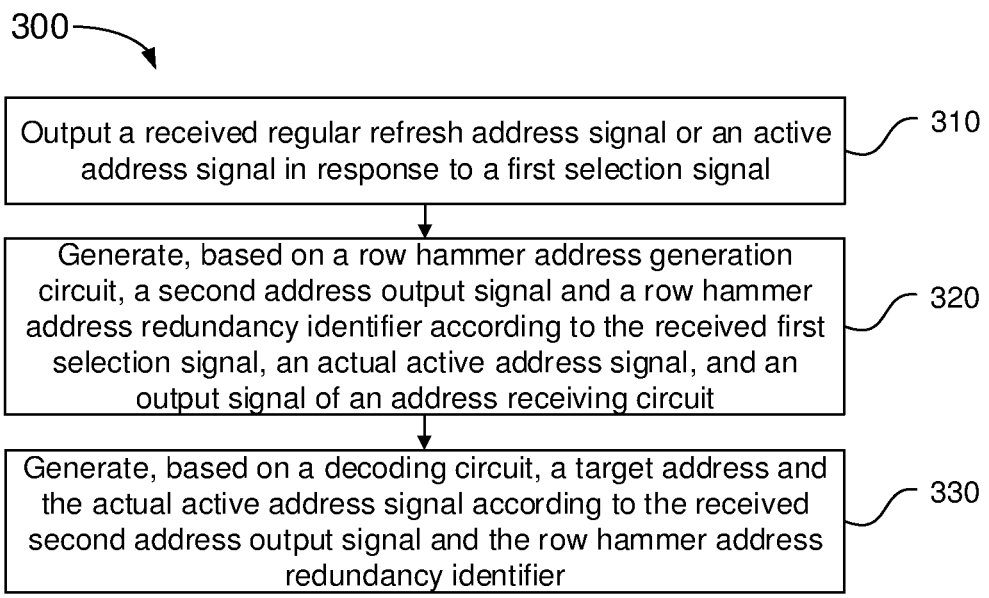
FIG. 8 and FIG. 9 are each a schematic flowchart of a control method of an address selection circuit according to different embodiments of the present disclosure.

Referring to FIG. 8, an embodiment of the present disclosure provides a control method of an address selection circuit, including the following steps.

Step 310: Output a received regular refresh address signal or an active address signal in response to a first selection signal.

Step 320: Generate, based on a row hammer address generation circuit, a second address output signal and a row hammer address redundancy identifier according to the received first selection signal, an actual active address signal, and an output signal of an address receiving circuit.

Step 330: Generate, based on a decoding circuit, a target address and the actual active address signal according to the received second address output signal and the row hammer address redundancy identifier.

Specifically, still referring to FIG. 8, the first address output signal may be output based on the address receiving circuit in response to the first selection signal, where the first address output signal includes a regular refresh address signal or an active address signal received by the address receiving circuit; then the second address output signal and the row hammer address redundancy identifier are generated based on the row hammer address generation circuit according to a received first selection signal and the first address output signal; and then the target address and the actual active address signal are generated based on the decoding circuit according to the received second address output signal and the row hammer address redundancy identifier, where the target address may include at least one of an array word line address, a row hammer redundancy address, and a row hammer repair address. According to this embodiment, a redundancy address in row hammer addresses of the target address can be automatically identified, to repair a word line corresponding to the redundancy address and refresh a row hammer address corresponding to the repaired word line, and whether the target address is a redundancy address can also be automatically identified, to repair the identified redundancy address and refresh a row hammer address corresponding to a word line after the repair, thereby improving the performance and reliability of the memory while ensuring that a density and a quantity of memory bits in a memory array are not reduced.

Figure 9:
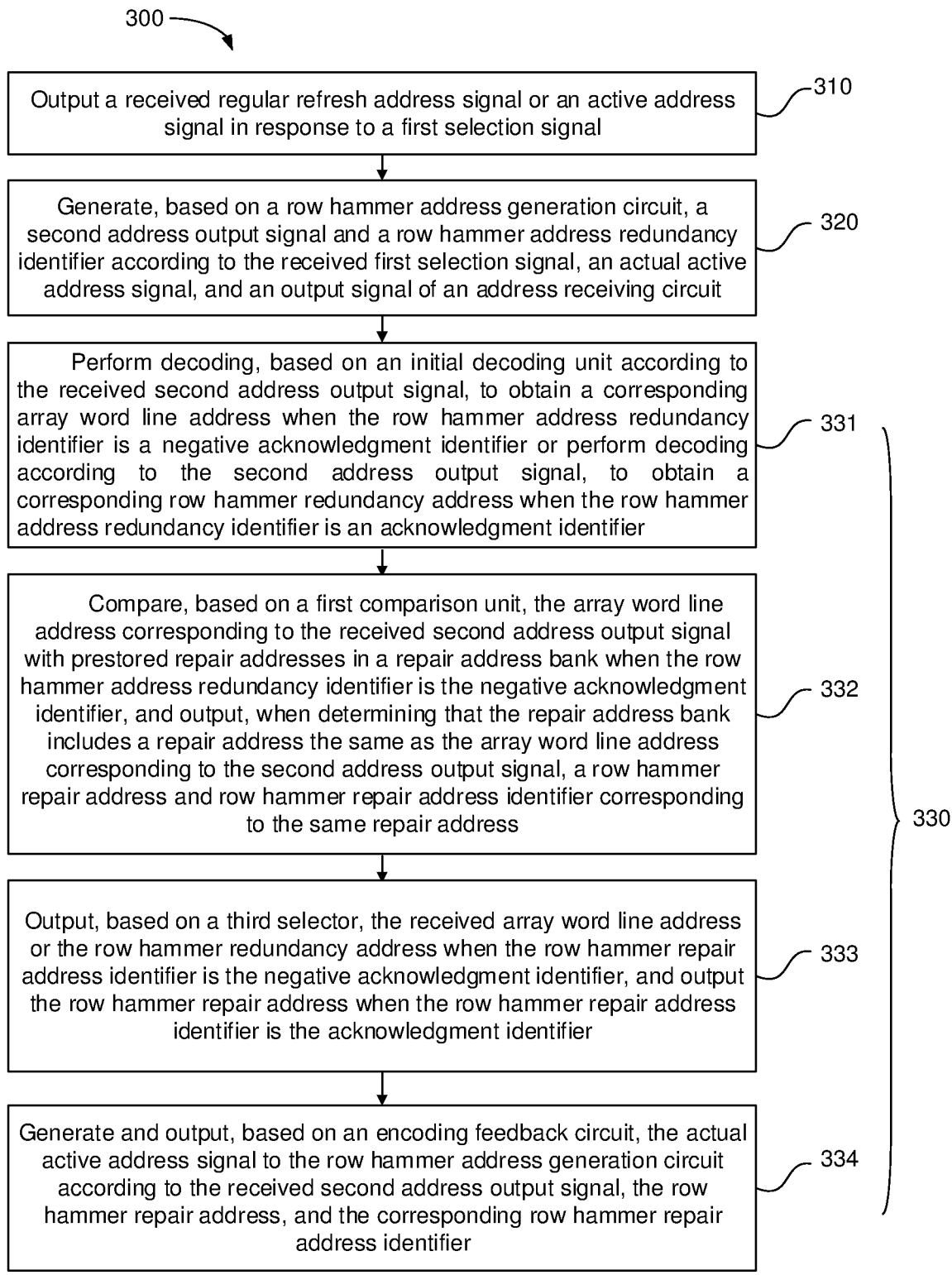

In an example, referring to FIG. 9, the target address may be specified to include at least one of the array word line address, the row hammer redundancy address, and the row hammer repair address; and the decoding circuit is specified to include an initial decoding unit, a first comparison unit, a third selector, and an encoding feedback circuit. The step of generating a target address and the actual active address signal may include the following steps.

Step 331: Perform decoding, based on the initial decoding unit according to the received second address output signal, to obtain a corresponding array word line address when the row hammer address redundancy identifier is a negative acknowledgment identifier or perform decoding according to the second address output signal, to obtain a corresponding row hammer redundancy address when the row hammer address redundancy identifier is an acknowledgment identifier.

Step 332: Compare, based on the first comparison unit, the array word line address corresponding to the received second address output signal with a prestored repair addresses in a repair address bank when the row hammer address redundancy identifier is the negative acknowledgment identifier, and output, when determining that the repair address bank includes a repair address the same as the array word line address corresponding to the second address output signal, a row hammer repair address and row hammer repair address identifier corresponding to the same repair address.

Step 333: Output, based on the third selector, the received array word line address or the row hammer redundancy address when the row hammer repair address identifier is the negative acknowledgment identifier, and output the row hammer repair address when the row hammer repair address identifier is the acknowledgment identifier.

Step 334: Generate and output, based on the encoding feedback circuit, the actual active address signal to the row hammer address generation circuit according to the received second address output signal, the row hammer repair address, and the corresponding row hammer repair address identifier.

Specifically, still referring to FIG. 9, the target address may be specified to include at least one of the array word line address, the row hammer redundancy address, and the row hammer repair address. According to this embodiment, a redundancy address in row hammer addresses of the target address can be automatically identified according to a row hammer address redundancy identifier hit0 and a row hammer repair address identifier hit1, to repair a word line corresponding to the redundancy address and refresh a row hammer address corresponding to the repaired word line, and whether the target address is a redundancy address can also be automatically identified, to repair the identified redundancy address and refresh a row hammer address corresponding to a word line after the repair, thereby improving the performance and reliability of a memory while ensuring that a density and a quantity of memory bits in a memory array are not reduced.

In an embodiment of the present disclosure, a computer-readable storage medium is provided. The computer-readable storage medium stores a computer program, and when executed by a processor, the computer program implements the control method of an address selection circuit according to any one of the above embodiments of the present disclosure.

It should be understood that although the steps in the flowcharts of FIG. 8 and FIG. 9 are shown in turn as indicated by arrows, these steps are not necessarily performed in turn as indicated by the arrows. The execution order of the steps is not strictly limited, and the steps may be executed in other orders, unless clearly described otherwise. Moreover, at least some of the steps in FIG. 8 and FIG. 9 may include a plurality of substeps or stages. The substeps or stages are not necessarily executed at the same time, but may be executed at different times. The execution order of the substeps or stages is not necessarily carried out sequentially, but may be executed alternately with other steps or at least some of the substeps or stages of other steps.

Those of ordinary skill in the art can understand that all or part of the processes of realizing the method in the above embodiments can be completed by a computer program instructing relevant hardware. The computer program may be stored in a non-volatile computer-readable storage medium. When the computer program is executed, the processes of the above method embodiments are performed. Any reference to a memory, a storage, a database, or other media used in the embodiments of the present disclosure may include a non-volatile and/or volatile memory. The non-volatile memory may include a read-only memory (ROM), a programmable ROM (PROM), an electrically programmable ROM (EPROM), an electrically erasable programmable ROM (EEPROM), or a flash memory. The volatile memory may include a random access memory (RAM) or an external cache memory. By way of illustration and not limitation, the RAM is available in a plurality of forms, such as a static RAM (SRAM), a dynamic RAM (DRAM), a synchronous DRAM (SDRAM), a double data rate SDRAM (DDRSDRAM), an enhanced SDRAM (ESDRAM), a synchlink DRAM (SLDRAM), a rambus direct RAM (RDRAM), a direct rambus dynamic RAM (DRDRAM), and a rambus dynamic RAM (RDRAM).

It should be noted that the above embodiments are merely for the purpose of description instead of limiting the present disclosure.

The technical characteristics of the above embodiments can be employed in arbitrary combinations. In an effort to provide a concise description of these embodiments, not all possible combinations of all technical characteristics of the embodiments are described, however, these combinations of technical characteristics should be construed as disclosed in the description as long as no contradiction occurs.

The above embodiments are only intended to illustrate several implementations of the present disclosure in detail, and they should not be construed as a limitation to the patentable scope of the present disclosure. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. An address selection circuit, comprising:
an address receiving circuit comprising:
a refresh address generator configured to generate a regular refresh address signal; and
a first selector configured to receive the regular refresh address signal, an active address signal, and a first selection signal and configured to: output the active address signal during a period when the first selection signal indicates an active state and output the regular refresh address signal during a period when the first selection signal indicates a refresh state;
a row hammer address generation circuit connected to the address receiving circuit and configured to: generate a second address output signal and a row hammer address redundancy identifier according to a received first selection signal, an actual active address signal, and the first address output signal; and
a decoding circuit connected to the row hammer address generation circuit and configured to: generate a target address and the actual active address signal according to a received second address output signal and the row hammer address redundancy identifier;
wherein the row hammer address generation circuit comprises:
a row hammer address generator configured to: receive the first selection signal and the actual active address signal, and generate a row hammer address signal and the row hammer address redundancy identifier according to the actual active address signal during the period when the first selection signal indicates the active state; and
a second selector configured to receive a second selection signal and connect to an output terminal of the row hammer address generator and an output terminal of the first selector and configured to: sequentially receive and output the first address output signal as the second address output signal before receiving the second selection signal; stop outputting the first address output signal when receiving the second selection signal, receive and output the row hammer address signal as the second address output signal, and output the row hammer address redundancy identifier; and resume receiving and outputting the first address output signal as the second address output signal after outputting the row hammer address signal.

2. The address selection circuit according to claim 1, further comprising:
a first counter connected to a control terminal of the second selector and configured to: count a quantity of times for which the second selector outputs the first address output signal to obtain a first count value and provide the second selection signal for the second selector when the first count value is equal to a first preset value.

3. The address selection circuit according to claim 2, wherein the first counter resets the first count value and stops outputting the second selection signal after the second selector outputs the row hammer address signal.

4. The address selection circuit according to claim 1, wherein the target address comprises at least one of an array word line address, a row hammer redundancy address, or a row hammer repair address; and the decoding circuit comprises:
an initial decoding unit connected to an output terminal of the second selector and configured to: receive the second address output signal and the row hammer address redundancy identifier, and perform decoding according to the second address output signal, to obtain a corresponding array word line address when the row hammer address redundancy identifier is a negative acknowledgment identifier, or perform decoding according to the second address output signal, to obtain a corresponding row hammer redundancy address when the row hammer address redundancy identifier is an acknowledgment identifier;
a first comparison unit connected to the output terminal of the second selector and configured to: compare the array word line address corresponding to the second address output signal with a prestored repair addresses in a repair address bank when the row hammer address redundancy identifier is the negative acknowledgment identifier, and output, when determining that the repair address bank comprises a repair address the same as the array word line address corresponding to the second address output signal, a row hammer repair address and a row hammer repair address identifier corresponding to the same repair address;
a third selector provided with a first input terminal connected to an output terminal of the initial decoding unit, a second input terminal configured to receive the row hammer repair address output by the first comparison unit, and a control terminal configured to receive the row hammer repair address identifier output by the first comparison unit, and configured to: output the array word line address or the row hammer redundancy address when the row hammer repair address identifier is the negative acknowledgment identifier and output the row hammer repair address when the row hammer repair address identifier is the acknowledgment identifier; and
an encoding feedback circuit connected to each of the row hammer address generation circuit, the second selector, and the first comparison unit and configured to: generate and output the actual active address signal to the row hammer address generation circuit according to the received second address output signal, the row hammer repair address, and a corresponding row hammer repair address identifier.

5. The address selection circuit according to claim 4, wherein
the acknowledgment identifier is "1", and the negative acknowledgment identifier is "0"; or
the acknowledgment identifier is "0", and the negative acknowledgment identifier is "1".

6. The address selection circuit according to claim 4, wherein the actual active address signal comprises the second address output signal and a row hammer repair address signal; and the encoding feedback circuit comprises:
an encoding unit connected to an output terminal of the first comparison unit and configured to: generate a row hammer repair address signal whose byte length is equal to a byte of the second address output signal according to the row hammer repair address; and a fourth selector provided with a first input terminal connected to the output terminal of the second selector, a second input terminal connected to an output terminal of the encoding unit, a control terminal connected to the output terminal of the first comparison unit, and an output terminal connected to an input terminal of the row hammer address generation circuit, and configured to: output the second address output signal when the row hammer repair address identifier is the negative acknowledgment identifier, and output the row hammer repair address signal when the row hammer repair address identifier is the acknowledgment identifier, to provide the actual active address signal for the row hammer address generator.

7. The address selection circuit according to claim 6, wherein the row hammer address generator comprises:

a row hammer address generation circuit configured to receive the first selection signal and connect to an input terminal of the second selector and an output terminal of the fourth selector and configured to generate, according to an active address corresponding to an actual active address signal whose quantity of active times is greater than a second preset value and during a period when the first selection signal indicates the active state, the row hammer address signal, to be provided for the second selector; and a row hammer address redundancy identifier generation unit connected to an output terminal of the row hammer address generation circuit and the input terminal of the second selector and configured to encode, when the row hammer repair address identifier represented by the row hammer repair address signal is the negative acknowledgment identifier, the row hammer repair address signal into the row hammer address redundancy identifier, to be provided for the second selector.

8. The address selection circuit according to claim 7, wherein the first selection signal comprises an active command; and the row hammer address generation circuit comprises:

a second timer configured to: receive the active command to obtain a single activation time of a target address corresponding to the active command, and output a timeout signal when the single activation time is greater than a preset time;

a row address latch unit configured to: receive the actual active address signal and connect to an output terminal of the second timer, and latch and output the actual active address signal when receiving the timeout signal; and a row hammer address generation unit configured to: receive the actual active address signal output by the row address latch unit, and generate the row hammer address signal according to a row hammer address corresponding to the actual active address signal.

9. The address selection circuit according to claim 8, wherein the row hammer address corresponding to the actual active address signal comprises: a row address of an adjacent previous row and a row address of an adjacent next row that are of a row corresponding to the target address.

10. A memory, comprising a memory block and the address selection circuit according to claim 1, wherein the address selection circuit is connected to the memory block and the address selection circuit is configured to output a target address to the memory block.

11. The memory according to claim 10, wherein the memory block comprises a target decoding unit and a memory array, wherein the target decoding unit is connected to an output terminal of a decoding circuit and configured to: convert the received target address into a memory cell strobe signal and send the memory cell strobe signal to a corresponding memory array.

12. A control method of an address selection circuit, comprising:

outputting a received regular refresh address signal or an active address signal in response to a first selection signal;

generating, based on a row hammer address generation circuit, a second address output signal and a row hammer address redundancy identifier according to a received first selection signal, an actual active address signal, and an output signal of an address receiving circuit; and generating, based on a decoding circuit, a target address and the actual active address signal according to a received second address output signal and the row hammer address redundancy identifier:

wherein the target address comprises at least one of an array word line address, a row hammer redundancy address, or a row hammer repair address; the decoding circuit comprises an initial decoding unit, a first comparison unit, a third selector, and an encoding feedback circuit; and the generating a target address and the actual active address signal comprises:

performing decoding, based on the initial decoding unit according to the received second address output signal, to obtain a corresponding array word line address when the row hammer address redundancy identifier is a negative acknowledgment identifier or performing decoding according to the second address output signal, to obtain a corresponding row hammer redundancy address when the row hammer address redundancy identifier is an acknowledgment identifier;

comparing, based on the first comparison unit, the array word line address corresponding to the received second address output signal with a prestored repair addresses in a repair address bank when the row hammer address redundancy identifier is the negative acknowledgment identifier, and outputting, when determining that the repair address bank comprises a repair address the same as the array word line address corresponding to the second address output signal, a row hammer repair address and a row hammer repair address identifier corresponding to the same repair address;

outputting, based on the third selector, a received array word line address or the row hammer redundancy address when the row hammer repair address identifier is the negative acknowledgment identifier, and outputting the row hammer repair address when the row hammer repair address identifier is the acknowledgment identifier; and generating and outputting, based on the encoding feedback circuit, the actual active address signal to the row hammer address generation circuit according to the received second address output signal, the row hammer repair address, and a corresponding row hammer repair address identifier.

* * * * *